United States Patent
Hoffmeyer et al.

(10) Patent No.: US 11,228,124 B1
(45) Date of Patent: Jan. 18, 2022

(54) CONNECTING A COMPONENT TO A SUBSTRATE BY ADHESION TO AN OXIDIZED SOLDER SURFACE

(71) Applicant: INTERNATIONAL BUSINESS MACHINES CORPORATION, Armonk, NY (US)

(72) Inventors: Mark K. Hoffmeyer, Rochester, MN (US); Steven P. Ostrander, Poughkeepsie, NY (US); Thomas Weiss, Poughkeepsie, NY (US); Thomas E. Lombardi, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/140,534

(22) Filed: Jan. 4, 2021

(51) Int. Cl.
| | | |
|---|---|---|
| *H01R 12/53* | (2011.01) | |
| *H05K 1/18* | (2006.01) | |
| *H05K 3/30* | (2006.01) | |
| *H01R 43/02* | (2006.01) | |

(52) U.S. Cl.
CPC ......... *H01R 12/53* (2013.01); *H01R 43/0256* (2013.01); *H05K 1/181* (2013.01); *H05K 3/305* (2013.01)

(58) Field of Classification Search
CPC ..................................................... H01R 12/53
USPC ....................................................... 174/261
See application file for complete search history.

(56) References Cited

U.S. PATENT DOCUMENTS

| | | | |
|---|---|---|---|
| 5,601,675 A | 2/1997 | Hoffmeyer et al. | |
| 5,629,564 A * | 5/1997 | Nye, III | H01L 24/03 257/762 |
| 6,084,775 A | 7/2000 | Bartley et al. | |
| 7,342,306 B2 | 3/2008 | Colbert et al. | |
| 7,435,622 B2 | 10/2008 | Colbert et al. | |
| 8,181,844 B2 * | 5/2012 | Hagen | B23K 35/262 228/121 |
| 8,747,579 B2 * | 6/2014 | Oshika | H01L 24/29 148/678 |
| 9,402,313 B2 | 7/2016 | Sakuyama et al. | |
| 10,111,322 B2 | 10/2018 | Hoffmeyer | |
| 2009/0236738 A1 | 9/2009 | Shim et al. | |
| 2011/0226513 A1 * | 9/2011 | Chuma | H01L 23/49816 174/254 |
| 2012/0042515 A1 * | 2/2012 | Shoji | H05K 3/3436 29/841 |
| 2015/0360934 A1 * | 12/2015 | Grabmaier | B81C 1/00095 361/772 |

FOREIGN PATENT DOCUMENTS

| | | |
|---|---|---|
| DE | 102006011232 | 11/2012 |
| JP | 4961165 B2 | 6/2012 |

* cited by examiner

*Primary Examiner* — Stanley Tso
(74) *Attorney, Agent, or Firm* — Nathan M. Rau

(57) ABSTRACT

In some embodiments, connecting a component to a substrate by adhesion to an oxidized solder surface includes: forming one or more conductive solder connections between the component and one or more conductive portions of the substrate; adhering the component to an oxidized surface of a solder portion applied to the substrate.

14 Claims, 9 Drawing Sheets

CONNECTING A COMPONENT TO A SUBSTRATE BY ADHESION TO AN OXIDIZED SOLDER SURFACE

BACKGROUND

Field of the Invention

The field of the invention is data processing, or, more specifically, methods, apparatus, and systems for connecting a component to a substrate by adhesion to an oxidized solder surface.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

Ever increasing performance and bandwidth demands drive a need for faster signaling with fewer hops between processors mounted to system motherboards. Some high speed interconnects are designed to travel through connectors that are directly mounted to central processing unit (CPU) laminate surfaces such that these off-module-surface signals may interface through pluggable cabling. Incorporation of multiple and pluggable interconnect elements affixed to module surfaces creates several challenges. For example, these interconnect elements must be mounted in a secure and stable fashion to prevent damage to fragile solder joints. Moreover, these interconnect elements must be able to be reworked or replaced in the event of damage or performance loss. Accordingly, there is a need for an approach for attaching a component to a substrate that is secure and stable so as to prevent damage to solder joints, but also allows for the component to be removed or replaced without damaging the substrate or neighboring components.

Existing solutions for attaching components such as connector components to a substrate use solder to attach component leads. An underfill material consisting of a curable epoxy or other polymer may also be used in conjunction with the solder attachment to provide an adhesive bond between the component and the substrate surface to strain relieve fragile connector solder joints and provide secure and stable connections. Providing strain relief to solder joints is critical for some connector components, especially so for components that need to undergo multiple connector plugging and unplugging events required for component test and component integration into a system. However, the strength of the adhesive bond makes it difficult to remove the component from the substrate in the event that the component needs to be replaced or repaired. Moreover, the strength of the adhesive bond increases the risk of damaging the substrate or surrounding components when attempting to remove the adhered component from the substrate.

SUMMARY

In some embodiments, a method for connecting a component to a substrate, includes: forming one or more conductive solder connections between the component and one or more conductive portions of the substrate; and adhering the component to an oxidized surface of a solder portion applied to the substrate. By adhering the component using an adhesive, the component attached to the substrate with a secure and stable connection, preventing load or strain on the one or more conductive solder connections. As the component is adhered to an oxidized surface of a solder portion, the component is removable by heating the solder portion, preventing damage to the substrate that would otherwise be caused by direct adhesion to the substrate surface. In some embodiments, an apparatus includes a substrate and a component attached to the substrate according to methods described herein. In some embodiments, a system includes such an apparatus.

Embodiments where the method includes heating the one or more conductive solder connections and the solder portion applied to the substrate; and separating the component from the substrate provides the technical advantage of allowing for a component to be removed from a substrate using heat application, thereby providing for easy component repair or replacement that would not be possible were the component directly adhered to the substrate. Embodiments where the solder portion applied to the substrate has a melting point lower than one or more other solder portions on the substrate allows for the component to be removed by applying an amount of heat that would not affect the solder connections of other components attached to the substrate. Embodiments where the solder portion of the substrate is applied to a non-surface-mount-defined copper feature of the substrate provides the advantage of creating a containment dam for underfilled adhesives used to attach the component to the substrate.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Incorporation of multiple and pluggable interconnect elements affixed to module surfaces allows for high-speed connections between processors. However, these interconnect elements must be able to be reworked or replaced in the event of damage or performance loss. For example, damage may occur through handling or over time due to multiple plugging and unplugging events.

Some connectors, including, but not limited to NearStack™ connectors made by Molex Corporation, and Firefly™ Connectors may by Samtec Corporation, are small and have numerous fragile surface mount solder joints. These fragile joints must be strain relieved to prevent solder joint cracking when connectors undergo multiple plugging and unplugging operations. Typically, a bead of curable epoxy or other another polymer is applied to the connector edges. The applied polymer wicks underneath the component along the edges between the substrate and a rib feature on the underside of the connector. Once cured, the underfilled polymer creates a rigid connector body securely and adhesively affixed to the substrate surface. However, the connector cannot be readily removed or replaced in the event of damage.

Figure 1A:
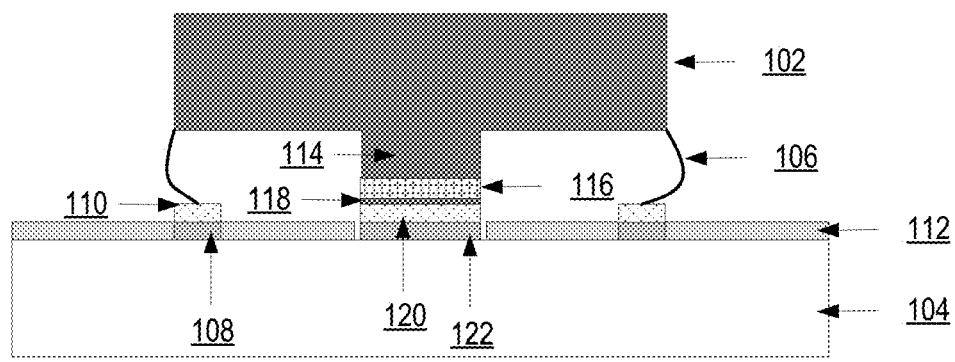
FIG. 1A is a diagram of an example view of a component attached to a substrate according to embodiments of the present disclosure.

To address these shortcomings, an example diagram for connecting a component to a substrate by adhesion to an oxidized solder surface is shown at FIG. 1A. Particularly, FIG. 1A shows a cross-section view of a component 102 connected to a substrate 104. In some embodiments, the component 102 and substrate 104 are included in an apparatus. In some embodiments, such an apparatus is included in a system and operatively coupled to one or more other components or devices. In this example, the component 102 includes a cable connector component, such as a socket or other pluggable component (e.g., a Nearstack connector). One skilled in the art that will appreciate that the approaches described herein for attaching the component 102 to the substrate 104 are applicable to any component and are not limited to connector components. The substrate 104 includes a printed circuit board (PCB), printed wiring board (PWB), or other substrate 104 as can be appreciated.

The component 102 includes leads 106. In some embodiments, the leads 106 are surface mount technology (SMT) leads 106. The leads 106 provide a signal pathway into the substrate 104 for the component 102. For example, where the component 102 includes a socket or other pluggable component, the leads 106 provide a signal pathway for the pluggable components to other components on the substrate 104. In this example, the leads 106 are conductively coupled to conductive pads 108 (e.g., copper pads 108) using solder joints 110. The substrate 104 also includes a layer of solder mask 112, a layer of polymer for protection of components such as the conductive pads 108 against oxidation and to prevent solder bridges from forming between closely spaced conductive pads 108. The conductive pads 108 may be conductively coupled to conductive traces or other signal pathways in the substrate 104.

The component 102 includes a rib feature 114. The rib feature 114 is a protrusion of the component 102 facilitating attachment of the component 102 to the substrate 104 through an underfilled adhesive 116. The adhesive 116 may include a curable epoxy, another polymer, or another adhesive as can be appreciated. The adhesive 116 may include various classes of adhesives 116, including thermoset, thermoplastic, and composite adhesives 116. In contrast to existing solutions where the adhesive 116 is applied directly to the rib feature 114 and the substrate 104 surface, the adhesive 116 is applied to an oxidized layer 118. For example, in some embodiments, the adhesive 116 is applied as an underfill where the adhesive is dispensed along a perimeter of a gap between the oxidized layer 118 and the rib feature 114. The adhesive 116 then fills the gap via capillary action to bond the oxidized layer 118 to the rib feature 114.

The oxidized layer 118 is an oxidized surface portion of a solder deposit 120. The solder deposit 120 has been applied to a pad 122. In some embodiments, the pad 122 includes a conductive pad 122 such as copper, or another material. In some embodiments, the pad 122 includes a rib feature, such as a copper rib feature. The pad 122 provides a suitable surface for depositing the solder deposit 120, in contrast to the surface of the substrate 104 which may not allow for a secure adhesion by the solder deposit 120. In some embodiments, the oxidized layer 118 is present as a thin, native oxide on solder deposit 120. In other words, the solder deposit 120 is naturally oxidized, where a continuous or discontinuous surface film of native surface oxide layer 118 forms during exposure to the environment or general process used to create solder deposit 120. In other embodiments, the oxidized layer 118 and its continuity or thickness on solder deposit 120 is intentionally increased though the use of additional processes. For example, such processes could include heating cycles in air, plasma ashing surface treatments, application of chemical agents, and the like.

As an example, to attach the component 102 to the substrate 104, copper features (e.g., the pad 122 and conductive pads 108) are applied to the substrate 104 via plating, etching, masking, or another approach. The solder deposit 120 is applied to the pad 122 and the solder joints 110 are applied to the conductive pads 108. In some embodiments, the solder joints 110 are selectively fluxed, or may have additional solder applied to them prior to placement of component 102, using a paste consisting of a distribution of solder particles mixed into a flux formulation. Fluxing includes the application of a chemical agent to prevent the oxidation of solder. Accordingly, selective fluxing of the solder joints 110 will prevent their oxidation while allowing the solder deposit 120 on the pad 122 to be oxidized.

The component 102 may then be placed or positioned on the substrate 104. The substrate 104 and component 102 may then be subjected to a solder reflow, where heat is applied, allowing the leads 106 of the component 102 to bond with the solder joints 110. Depending on how the solder deposit 120 is applied to the pad 122, reflow will allow for multiple deposits to melt and form a layer of solder on the pad 122. Adhesive 116 is then applied to external edges of the component body at rib locations 114 in proximity to the oxidized layer 118 (e.g., after oxidation of the solder deposit 120). The adhesive is allowed time to wick under the component, to fill the gap and form an underfill bond line between the component rib feature 114 and the oxidized layer 118. After curing the underfilled adhesive 116, the component 102 is then attached to the substrate 104.

Figure 1B:
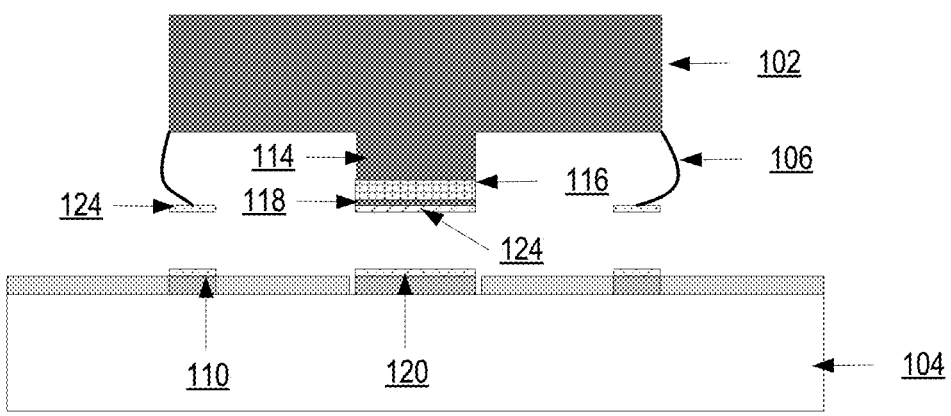
FIG. 1B is a diagram of an example view of a component removed from a substrate after being attached according to embodiments of the present disclosure.

By adhering the rib feature 114 to the oxidized layer 118 instead of adhering the rib feature 114 directly to the substrate 104, the component 102 can be easily and non-destructively removed from the substrate 104 as shown in FIG. 1B. For example, heat can be locally applied to the component 102, melting or weakening the solder deposit 120 and solder joints 110. When the component 102 is removed, the adhesive 116 remains adhered to the oxidized layer 118. The oxidized layer 118 may have a thin layer of residual solder 124 bonded to it when the component 102 is removed. The leads 106 may also have residual solder 124 after component 102 removal due to the melting or weakening of the solder joints 110. As shown, the component 102 can be removed without breaking the cured adhesive 116 or damaging the substrate 104 due to direct contact between cured adhesive 116 and the substrate 104 surface. Accordingly, a new component 102 can be applied to the substrate by soldering the leads 106 of a new component to the conductive pads 108 and underfilling adhesive 116 on a rib feature 114 of the new component 102, and replacing any portions of the solder deposit 120, as necessary.

The example approaches described above for connecting a component to a substrate by adhesion to an oxidized solder surface is discussed in the context of attaching a component having passive connectors that carry electrical signals, where the construct is used to protect the connectors from damage typically caused by mechanical forces from unplugging and unplugging events. It is understood that the approaches described above may also be applicable to other types of components. For example, the approaches described above may be used on components including active devices requiring both electrical and structural connectivity, where such active components may be subject to a finite amount of active component fallout per supplied-defined "shipped product quality levels" (SPQLs). Accordingly, there may be a need to remove and replace faulty devices while ensuring electrical and structural connectivity. Additional examples that can leverage use of approaches described above also include active devices subject to mechanical forces of plugging and unplugging, including active modules that get plugged and unplugged into circuit boards as part of electronic systems, or cables with embedded active electronics, including optical transceiver cables that get plugged into connectors mounted within system electronics.

Figure 2A:
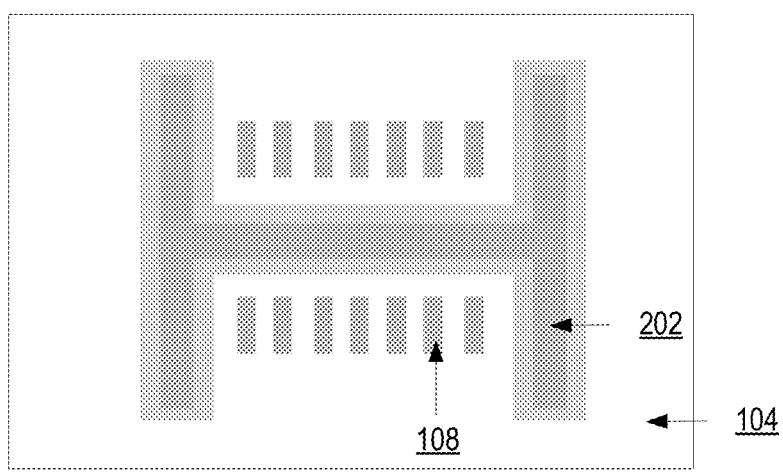
FIG. 2A is a diagram of an example view of a substrate for connecting a component to a substrate by adhesion to an oxidized solder surface according to embodiments of the present disclosure.

FIG. 2A shows an overhead view of a substrate 104 for connecting a component to a substrate by adhesion to an oxidized solder surface. As shown in FIG. 2A, the substrate 104 includes a rib shaped feature 202 of copper or another material. Shown as pad 122 in FIG. 1A, the rib feature 202 provides a surface to which solder will be applied and oxidized for adhesion to a rib feature 114 of a component 102. In some embodiments, the rib feature 202 includes a floating (e.g., ungrounded) rib feature 202. In other embodiments, the rib feature 202 may be tied to ground at one or more points. In some embodiments, the rib feature 202 is a non-surface mount (e.g., non-SM) defined rib feature 202 to provide a containment dam for underfilled adhesive 116. The substrate 104 of FIG. 2A also shows multiple conductive pads 108. The conducive pads 108 are surface-mount (SM) defined conductive pads 108 providing conductive signal pathways for leads 106 of a component 102.

Figure 2B:
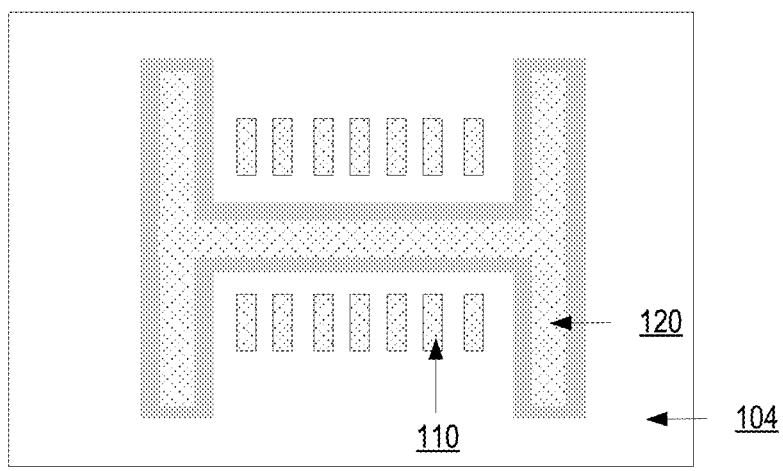
FIG. 2B is a diagram of another example view of a substrate for connecting a component to a substrate by adhesion to an oxidized solder surface according to embodiments of the present disclosure.
Figure 2C:
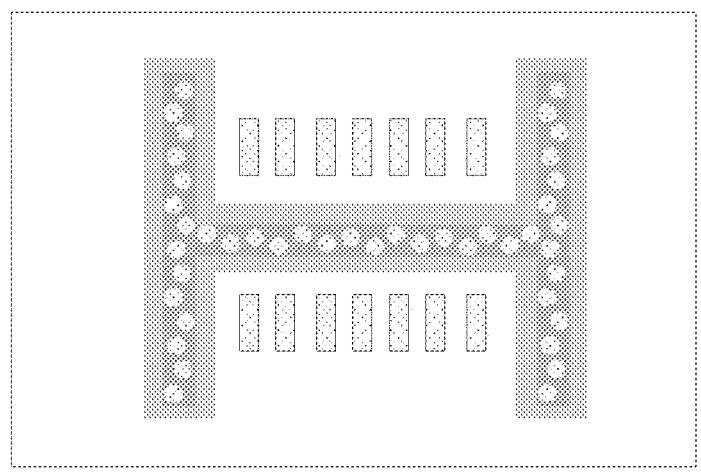
FIG. 2C is a diagram of an example view of a substrate for connecting a component to a substrate by adhesion to an oxidized solder surface according to embodiments of the present disclosure.
Figure 2D:
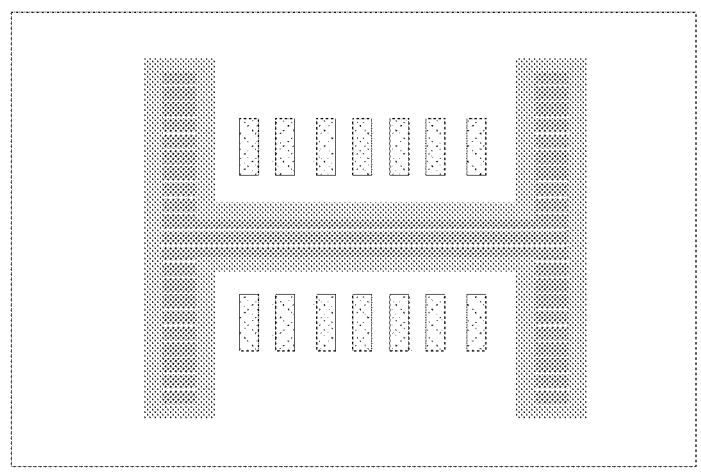
FIG. 2D is a diagram of another example view of a substrate for connecting a component to a substrate by adhesion to an oxidized solder surface according to embodiments of the present disclosure.

As shown in FIG. 2B, solder is then applied to the copper features of the substrate 104 (e.g., to the conductive pads 108 and the rib feature 202), thereby forming a solder deposit 120 and solder joints 110. In some embodiments, application of solder is performed using electroplating or immersion plating of tin or a tin alloy. In other embodiments, portions of the substrate 104 are masked and the exposed, unmasked copper features are coated with liquified solder. In further embodiments, portions of solder are deposited on the feature using solder paste applied through a stencil with a specific aperture shape or array of aperture shapes. For example, in some embodiments, solder is deposited on the copper features as dots or stripes of solder. For example, application of solder using a dot pattern as seen in FIG. 2C can be used to control volume and post-reflow solder height and height variation. The use of a stripe or row pattern as seen in FIG. 2D creates grooves that can be used to control solder height and enable enhanced underfill flow. During reflow, as heat is applied, these patterned deposits melt to reform into a continuous layer of solder. After reflow, air or elevated temperatures may be applied to the solder deposit 120 to create an oxidized layer 118. An optional mechanical coining operation may also be used on the solder deposit 120 and its oxidized surface layer after it is reflowed to the surface if additional surface flatness and height control is required.

In some embodiments, the solder applied to the copper features and used to bond the component 102 to the substrate 104 may have a melting point less than solder used to attach other components to the substrate 104. For example, assume that the component 102 is a connector component located near a CPU module also attached to the substrate 104. The CPU module may be attached to the substrate using solder having a high temperature melting point. The component 102 may be attached to the substrate 104 near the CPU module using solder having a lower melting point. Thus, residual heat applied to the component 102 to allow for removal of the component 102 from the substrate 104 will not melt the solder used to attach the chip or other components on a CPU module, thereby reducing unintentional separation of other components from the substrate 104.

Figure 3:
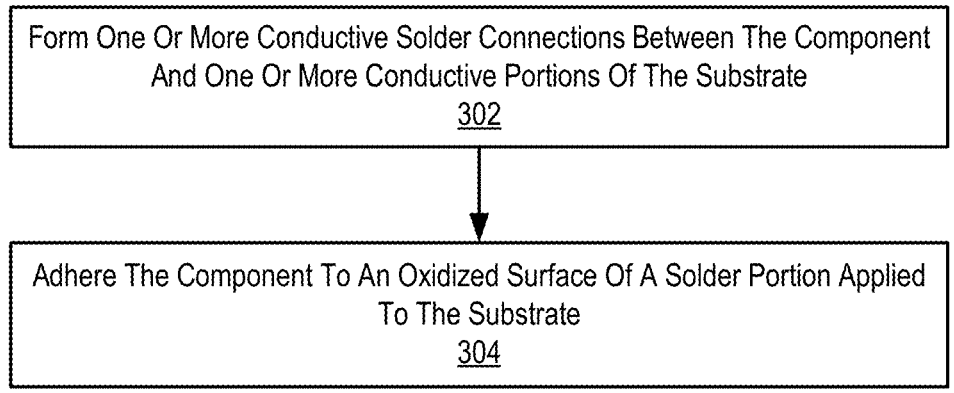
FIG. 3 is a flowchart of an example method for connecting a component to a substrate by adhesion to an oxidized solder surface according to embodiments of the present disclosure.

For further explanation, FIG. 3 sets forth a flow chart illustrating an example method for connecting a component to a substrate by adhesion to an oxidized solder surface according to embodiments of the present invention that includes forming 302 one or more conductive solder connections between the component 102 and one or more conductive portions of the substrate 104. The substrate 104 may include, for example, a printed circuit board (PCB), printed wiring board (PWB), a module assembled on an organic PCB or PWB substrate, or other component as can be appreciated. For example, the substrate 104 may include a motherboard onto which a CPU module is mounted. The component 102 may include a connector component such as a socket or slot into which a cable or other interconnection may be plugged. For example, the component 102 may include a connector component for mounting near the CPU module to facilitate high-speed connections to and from a processor mounted to the CPU module.

The one or more conductive portions of the substrate 104 may include, for example, conductive pads 108 of copper or another conductive material. The conductive pads 108 may be conductively coupled or bonded to conductive traces within the substrate 104. Thus, the conductive pads 108 provide connection points to conductive traces or other signal pathways within the substrate 104. The one or more conductive solder connections may be formed by creating solder joints 110 bonding leads 106 of the component 102 to the conductive pads 108. For example, solder may be deposited on the conductive pads 108 and the component 102 placed such that the leads 106 are aligned with the deposited solder on the conductive pads 108. Reflow may then be performed by subjecting the component 102 and substrate 104 to heat, thereby melting the solder deposited on the conductive pads 108. When cooled, the solder will then be bonded to the leads 106 and the conductive pads 108.

The method of FIG. 3 also includes adhering 304 the component 102 to an oxidized surface of a solder portion applied to the substrate 104. For example, the solder portion may be applied as a solder deposit 120 to a pad 122 or rib feature 202 of the substrate. As the substrate 104 surface may not provide a suitable bond for the solder portion, the solder portion is applied to another feature of the substrate 104, such as a copper feature described above. For example, solder is applied to a non-surface-mount-defined copper rib feature. As the copper rib feature is not surface-mount defined, the copper rib provides a dam or barrier to contain underfilled adhesive 116. Moreover, the use of copper provides a suitable surface for bonding the applied solder. The solder portion may be oxidized, thereby forming an oxidized layer 118 of solder to which the component 102 is adhered.

The component 102 is adhered to the oxidized surface using a curable epoxy or other polymer. Thus, an adhesive connection is formed using the curable polymer. Accordingly, includes adhering 304 the component 102 to the oxidized surface includes curing an adhesive 116 applied to the component 102. The adhesive 116 may include various classes of adhesives, including thermoset, thermoplastic, and composite adhesives 116. The adhesive 116 may be cured through exposure to air, heat, chemical agents, and the like. In some embodiments, adhering 304 the component 102 to the oxidized surface includes underfilling the adhesive 116 to a rib feature 114 of the component 102. For example, in some embodiments, the adhesive 116 is applied as an underfill where the adhesive is dispensed along a perimeter of a gap between the oxidized layer 118 and the rib feature 114. The adhesive 116 then fills the gap via capillary action to bond the oxidized layer 118 to the rib feature 114. The use of the cured adhesive 116 provides a secure and stable bond to the component 102, providing support for and preventing breakage of the solder joints 110 that bond the leads 106 to the conductive pads 108. As the underfilled adhesive 116 contacts and bonds with the oxidized layer 118 of the solder deposit 120, the cured adhesive 116 does not make contact with the substrate 104 surface itself. Thus, the component 102 may be separated from the substrate 104 by heating and melting the solder deposit 120, allowing the component 102 to be removed without damage that would be caused by adhesive 116 bonded to the substrate 104 surface.

Figure 4:
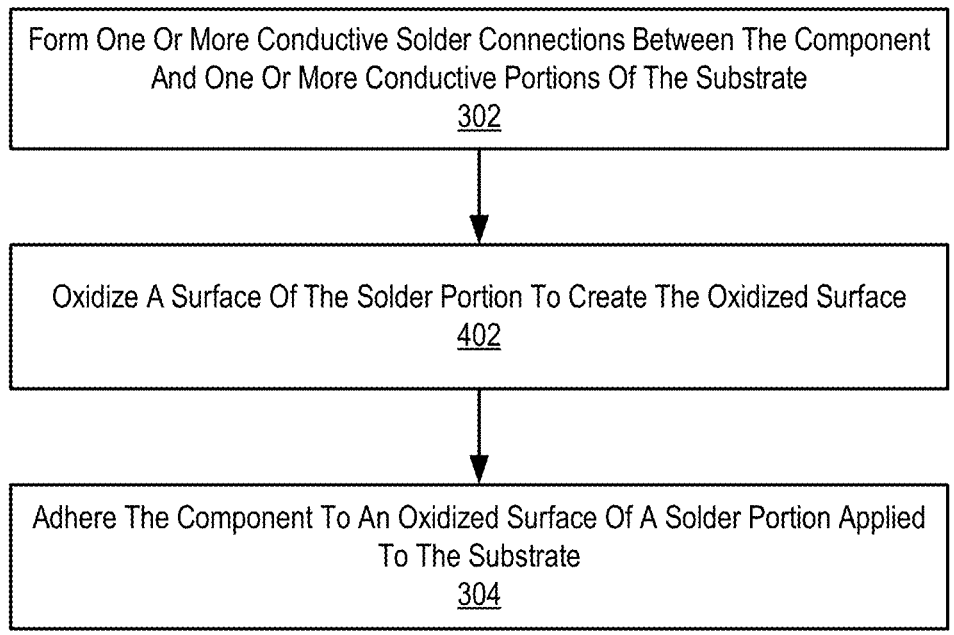
FIG. 4 is a flowchart of another example method for connecting a component to a substrate by adhesion to an oxidized solder surface according to embodiments of the present disclosure.

For further explanation, FIG. 4 sets forth a flow chart illustrating another example method for connecting a component to a substrate by adhesion to an oxidized solder surface according to embodiments of the present invention. The method of FIG. 4 is similar to FIG. 3 in that the method of FIG. 4 includes forming 302 one or more conductive solder connections between the component 102 and one or more conductive portions of the substrate 104; and adhering 304 the component 102 to an oxidized surface of a solder portion applied to the substrate 104.

FIG. 4 differs from FIG. 3 in that the method of FIG. 4 includes oxidizing 402 a surface of the solder portion to create the oxidized surface. The solder portion is oxidized though heat application, exposure to air, plasma ashing, exposure to chemical agents, or other approaches as can be appreciated. For example, assume that the solder portion includes a solder deposit 120, and that solder joints 110 form the conductive solder connections between the conductive portions of the substrate 104 and the component 102. The solder deposit 120 may be selectively oxidized by selectively fluxing the solder joints 110 by applying a chemical agent to the solder joints 110 to prevent oxidation. Thus, an oxidation process will selectively oxidize the solder deposit 120 and not oxidize the solder joints 110. It is understood that the solder deposit 120 may also be selectively oxidized by other approaches, such as masking or otherwise preventing exposure to oxidizing agents by the solder joints 110. Moreover, it is understood that the solder deposit 120 may be oxidized without selective oxidation (e.g., by an oxidizing process applied to the entirety of the substrate 104 and attached components). In further embodiments, oxidizing 402 the surface of the solder portion may occur naturally without active acceleration. Thus, the oxidized layer 118 is a naturally occurring oxidized layer. By oxidizing 402 the surface of the solder portion, a surface is created for an adhesive 116 to bond, thereby forming an adhesive bond to the component 102 (e.g., to a rib feature 114 of the component 102).

Figure 5:
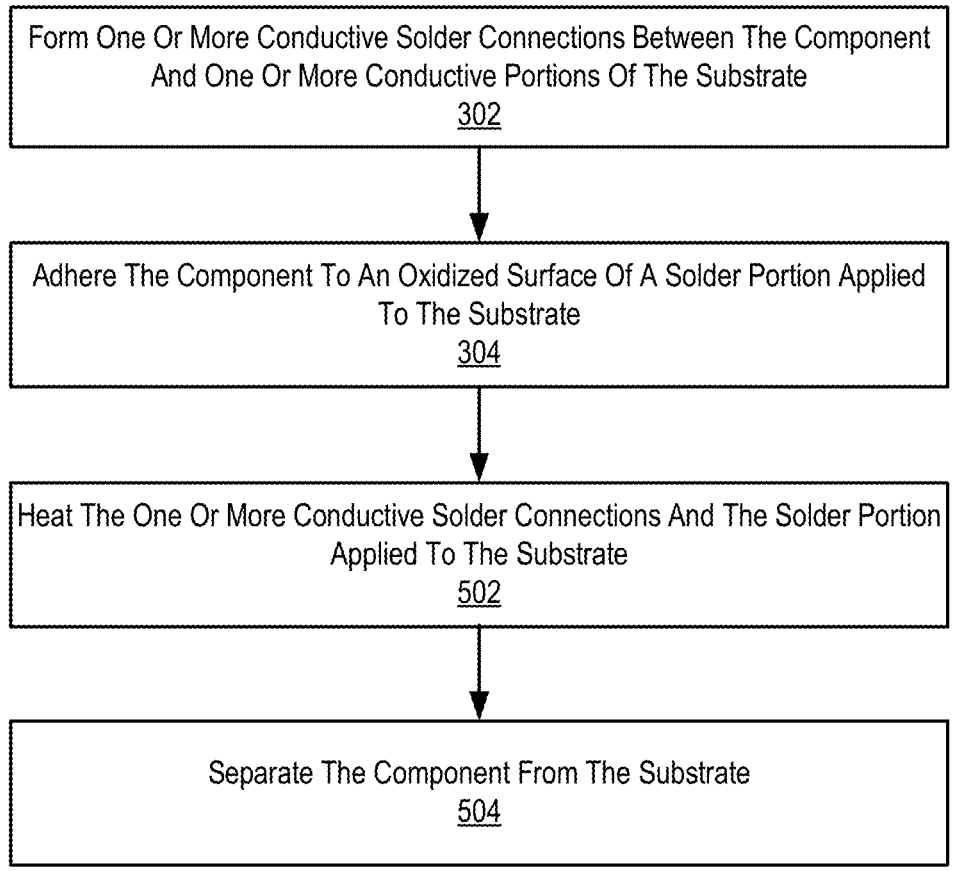
FIG. 5 is a flowchart of another example method for connecting a component to a substrate by adhesion to an oxidized solder surface according to embodiments of the present disclosure.

For further explanation, FIG. 5 sets forth a flow chart illustrating another example method for connecting a component to a substrate by adhesion to an oxidized solder surface according to embodiments of the present invention. The method of FIG. 5 is similar to FIG. 3 in that the method of FIG. 5 includes forming 302 one or more conductive solder connections between the component 102 and one or more conductive portions of the substrate 104; and adhering 304 the component 102 to an oxidized surface of a solder portion applied to the substrate 104.

FIG. 5 differs from FIG. 3 in that the method of FIG. 5 includes heating 502 the one or more conductive solder connections and the solder portion applied to the substrate 104. The component 102 is connected to the substrate 104 by the formed 302 conductive solder connections (e.g., solder joints 110 bonding leads 106 to conductive pads 108) and also by the adhesive bond between the component 102 and the oxidized surface of the solder portion (e.g., an oxidized layer 118 of a solder deposit 120). Heating 502 the one or more conductive solder connections and the solder portion applied to the substrate 104 melts the solder connecting the component 102 to the substrate, allowing the component 102 to be removed from the substrate 104.

The method of FIG. 5 further differs from FIG. 3 in that the method of FIG. 5 also includes separating 504 the component 102 from the substrate 104. As the component 102 is removable solely through heating solder, the cured adhesive 116 does not need to be broken. Moreover, as the cured adhesive 116 only contacts oxidized solder, removal of the component 102 does not risk damaging the substrate 104 in contrast to existing solutions where adhesive 116 is bonded directly to a substrate 104 surface. This allows for the component 102 to be easily replaced with another component 102 or for the component 102 to be repaired and reattached in the event of component 102 damage or malfunction.

In view of the explanations set forth above, readers will recognize that the benefits of connecting a component to a substrate by adhesion to an oxidized solder surface according to embodiments of the present invention include:

Improved attachment of components to substrates by providing for a stable, supportive bond for components that resists damage to fragile bonds such as solder joints.

Improved attachments of components to substrates by eliminating direct adhesive contact between components and the substrate surface, allowing for easy component removal and replacement as required.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method for connecting a component to a substrate, the component comprising a cable connector component, by adhesion to an oxidized solder surface, comprising:
    forming one or more conductive solder connections between the component and one or more conductive portions of the substrate; and
    adhering the component to an oxidized surface of a solder portion applied to the substrate,
    wherein the solder portion applied to the substrate has a melting point lower than one or more other solder portions on the substrate.

2. The method of claim 1, further comprising oxidizing a surface of the solder portion to create the oxidized surface.

3. The method of claim 1, further comprising:
    heating the one or more conductive solder connections and the solder portion applied to the substrate; and
    separating the component from the substrate.

4. The method of claim 1, wherein adhering the component to the oxidized surface comprises underfilling an adhesive between the oxidized surface and the component.

5. The method of claim 1, wherein the solder portion of the substrate is applied to a non-surface-mount-defined copper feature of the substrate.

6. The method of claim 1, wherein the solder portion of the substrate is applied to a grounded copper feature of the substrate.

7. An apparatus, comprising:
    a substrate; and
    a component comprising a cable connector component and coupled to the substrate by:
        one or more conductive solder connections between the component and one or more conductive portions of the substrate; and
        an adhesive connection between the component and an oxidized surface of a solder portion applied to the substrate,
    wherein the solder portion applied to the substrate has a melting point lower than one or more other solder portions on the substrate.

8. The apparatus of claim 7, wherein the adhesive connection comprises an underfilled adhesive connection between the oxidized surface and the component.

9. The apparatus of claim 7, wherein the solder portion of the substrate is applied to a non-surface-mount-defined copper feature of the substrate.

10. The apparatus of claim 7, wherein the solder portion of the substrate is applied to a grounded copper feature of the substrate.

11. A system, comprising:
    an apparatus comprising:
    a substrate; and
    a component comprising a cable connector component and coupled to the substrate by:
        one or more conductive solder connections between the component and one or more conductive portions of the substrate; and
        an adhesive connection between the component and an oxidized surface of a solder portion applied to the substrate,
    wherein the solder portion applied to the substrate has a melting point lower than one or more other solder portions on the substrate.

12. The system of claim 11, wherein the adhesive connection comprises an underfilled adhesive connection between the oxidized surface and the component.

13. The system of claim 11, wherein the solder portion of the substrate is applied to a non-surface-mount-defined copper feature of the substrate.

14. The system of claim 11, wherein the solder portion of the substrate is applied to a grounded copper feature of the substrate.

* * * * *